United States Patent
Jeon (10) Patent No.: US 7,283,003 B2
(45) Date of Patent: Oct. 16, 2007

(54) RESET SIGNAL GENERATORS FOR A FREQUENCY-PHASE DETECTOR AND METHODS OF GENERATING RESET SIGNALS FOR THE SAME

(75) Inventor: Ha-Jun Jeon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 132 days.

(21) Appl. No.: 11/179,953

(22) Filed: Jul. 12, 2005

(65) Prior Publication Data

US 2006/0022759 A1   Feb. 2, 2006

(30) Foreign Application Priority Data

Jul. 30, 2004   (KR) .................... 10-2004-0060120

(51) Int. Cl.
*G01R 25/08* (2006.01)
*H03L 7/87* (2006.01)

(52) U.S. Cl. .................... 331/16; 327/157; 327/536

(58) Field of Classification Search ............ 331/16; 327/157, 536
See application file for complete search history.

(56) References Cited

U.S. PATENT DOCUMENTS 6,140,853 A * 10/2000 Lo .................. 327/157
6,430,244 B1 * 8/2002 Ryu ................ 375/376
6,566,923 B1   5/2003 Pettersen .......... 327/157

FOREIGN PATENT DOCUMENTS

JP    10-190450      7/1998
KR    1020030003416  1/2003

* cited by examiner

*Primary Examiner*—Benny Lee
*Assistant Examiner*—James Goodley
(74) *Attorney, Agent, or Firm*—Myers Bigel Sibley & Sajovec (57) ABSTRACT

Reset signal generators for a frequency-phase detector include a first signal source circuit is coupled to a pump-up signal of the frequency-phase detector. The first signal source circuit includes a first load therein establishing a voltage level at a first node when a first current flows through the first load. The first signal source circuit is configured to activate the first current responsive to the pump-up signal. A second signal source circuit is coupled to a pump-down signal of the frequency-phase detector. The second signal source circuit includes a second load therein establishing a voltage level at a second node when a second current flows through the second load. The second signal source circuit is configured to activate the second current responsive to the pump-down signal. A logic circuit is configured to generate the reset signal responsive to the voltage levels at the first node and at the second node.

17 Claims, 6 Drawing Sheets

RESET SIGNAL GENERATORS FOR A FREQUENCY-PHASE DETECTOR AND METHODS OF GENERATING RESET SIGNALS FOR THE SAME

CROSS-REFERENCE TO RELATED APPLICATION

This application claims the benefit under 35 U.S.C. § 119(a) of Korean Patent Application No. 2004-0060120 filed on Jul. 30, 2004, the contents of which are herein incorporated by reference in their entirety.

BACKGROUND OF THE INVENTION

The present invention relates to phase locked loops. More particularly, the present invention relates to frequency-phase detectors for phase locked loops and methods for operating the same.

Figure 1:
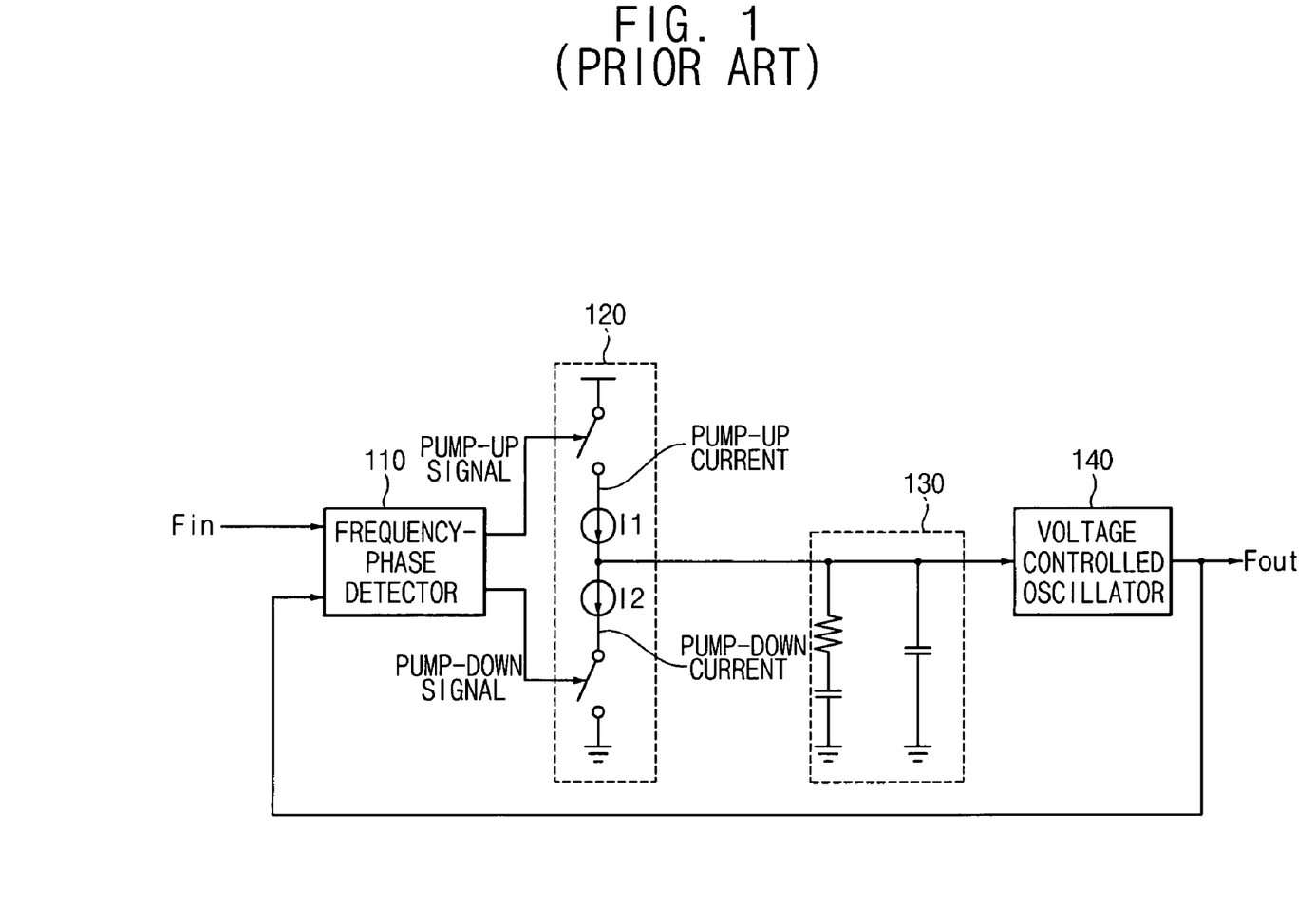
FIG. 1 is a circuit diagram illustrating a conventional phase locked loop.

FIG. 1 is a circuit diagram illustrating a conventional phase locked loop (PLL). As shown in FIG. 1, the phase locked loop includes a frequency-phase detector (PFD) 110, a charge pump 120, a loop filter 130 and a voltage controlled oscillator (VCO) 140.

The frequency-phase detector 110 detects frequency differences and/or phase differences between an input signal Fin and an output signal Fout, and then sends to the charge pump 120 pump-up/down signals. The pump-up/down signals correspond to error signals based on detected frequency and/or phase differences.

The charge pump 120 provides an up current I1 or a down current I2 through a pump-up switch and a pump-down switch, respectively, in response to the pump-up signal and the pump-down signal, so as to charge or discharge capacitors in the loop filter 130. The voltage controlled oscillator 140 outputs the output signal Fout having frequency proportional to a voltage provided from the loop filter 130. The output signal Fout is fed back to the frequency/phase detector 110 to be compared with the input signal Fin.

Thus, as described above, the phase locked loop circuit of FIG. 1 may output the output signal Fout having a phase and a frequency that are controlled to track and match those of the input signal Fin, and, when the input and output match, the state of the phase locked loop circuit may be referred to as a lock state. Before the phase locked loop reaches the lock state, the phase difference between the two inputs Fin and Fout becomes progressively smaller. Accordingly, as the difference becomes very small, a width of the pump-up/down signals also becomes very narrow. As a result of this narrow signal width, the charge pump 120 may fail to respond to the up/down signals and may not charge or discharge the capacitors of the loop filter 130, despite the existence of a phase error, within a certain range of phase difference. Such a range of non-corrected error may be referred to as a dead zone. The dead zone may cause a static phase error and degrade a jitter characteristic of the phase lock loop.

To address such problems, a conventional PLL typically delays a reset signal(s) of the frequency-phase detector, which is reset when both the up signal and the down signal are activated. The dead zone may be reduced or even eliminated by delaying the reset signal(s) through a delay circuit for a selected time after both of the up/down signals are activated.

Figure 2:
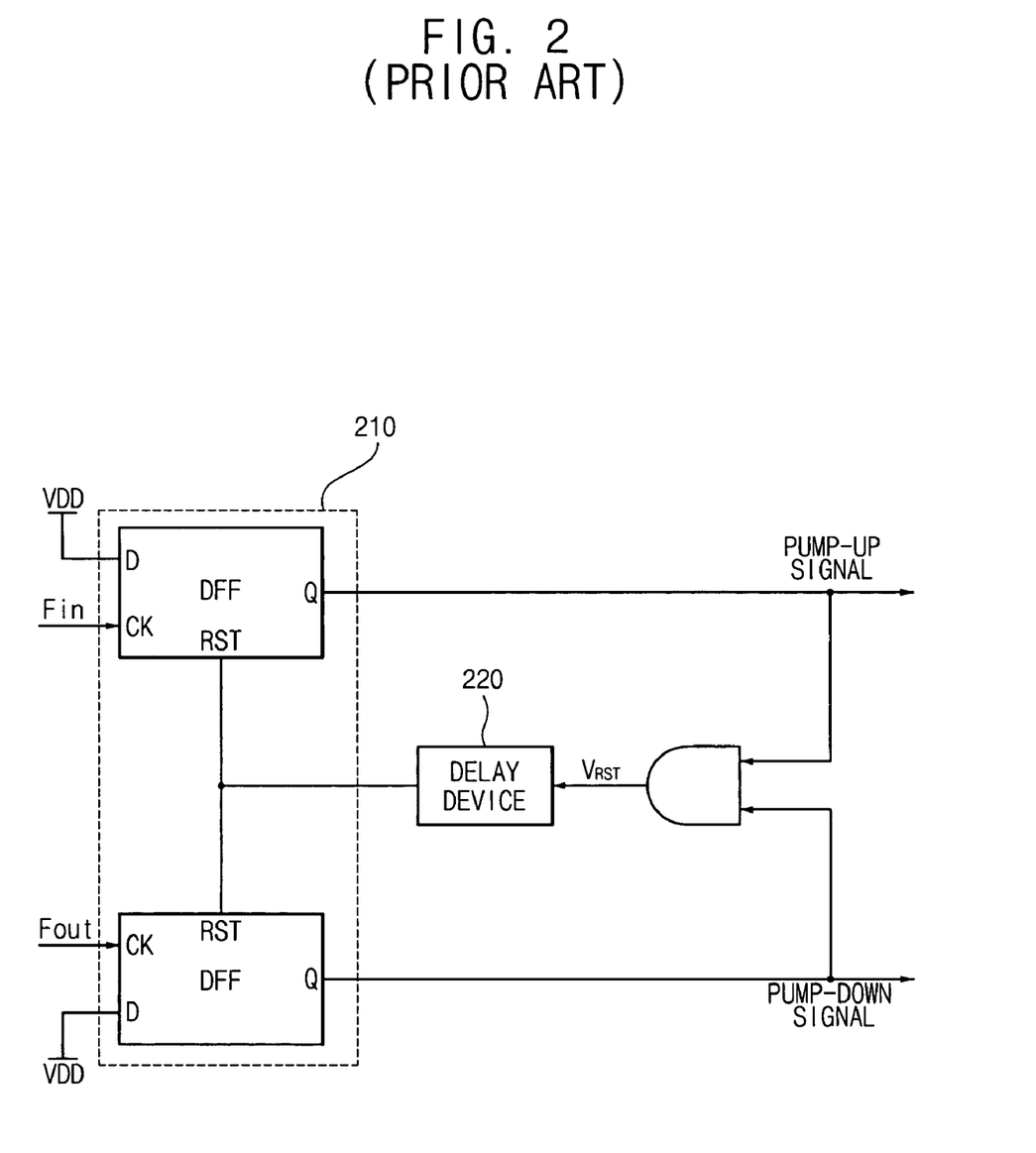
FIG. 2 is a circuit diagram illustrating a conventional frequency/phase detector having a reset signal generator.

FIG. 2 is a circuit diagram illustrating a conventional frequency/phase detector having a reset signal generator. As shown in FIG. 2, a reset signal $V_{RST}$ is activated when both of the pump-up/down signals are activated. The reset signal $V_{RST}$ resets the frequency-phase detector 210 after a selected delay time provided by passing the reset signal $V_{RST}$ through a delay device 220.

As a result of the circuit of FIG. 2, although a phase difference between two inputs Fin and Fout of the frequency-phase detector 210 becomes very small, widths of the up/down signals may be maintained for a delay time of the delay device 220, and, thus, the dead zone may be decreased or even eliminated.

Various problems may be encountered with the circuit of FIG. 2. In particular, the delay time may vary depending upon manufacturing process variations for the circuit and it may be difficult to determine a suitable delay time because the delay time generally varies depending upon the manufacture process variations during actual circuit implementations. If the delay time is set too long, the current consumption generally increases in the lock state. If the delay time is set too short, the dead zone may not be effectively reduced/removed. As a result, a static phase error may occur and jitter characteristics of the phase lock loop may be degraded.

U.S. Pat. No. 6,566,923 "PHASE-FREQUENCY DETECTOR AND CHARGE PUMP WITH FEEDBACK" discloses a charge pump, which has two switches to be controlled simultaneously by signals to charge or to discharge the charge pump, respectively. Additionally, a circuit to provide a reset signal is disclosed, the circuit activating the reset signal only if both of the signals are in a flowing state. Therefore, this approach may more effectively reset the phase-frequency detector than the frequency-phase detector that provides a delayed reset signal through the delay device 220 as described with reference to FIG. 2.

The U.S. Pat. No. 6,566,923 provides signals picked up by a drain switch approach, from the two switches, which are coupled to each of two current sources. The drain switch approach may, however, cause a current spike due to a sudden voltage change between two terminals of each of the current sources. For the circuit of U.S. Pat. No. 6,566,923, when both of the two switches are in a closed state, a voltage between a source voltage level and ground level may be applied onto the current source, which may overburden the current source and increase current consumption. Furthermore, the reset signal may be generated before the charge pump provides sufficient up or down currents.

SUMMARY OF THE INVENTION

Embodiments of the present invention provide reset signal generators for a frequency-phase detector. A first signal source circuit is coupled to a pump-up signal of the frequency-phase detector. The first signal source circuit includes a first load therein establishing a voltage level at a first node when a first current flows through the first load. The first signal source circuit is configured to activate the first current responsive to the pump-up signal. A second signal source circuit is coupled to a pump-down signal of the frequency-phase detector. The second signal source circuit includes a second load therein establishing a voltage level at a second node when a second current flows through the second load. The second signal source circuit is configured to activate the second current responsive to the pump-down signal. A logic circuit is configured to generate the reset signal responsive to the voltage levels at the first node and at the second node.

In further embodiments of the present invention, the pump-up signal activates a pump-up switch of a charge pump and the pump-down signal activates a pump-down switch of the charge pump. The first signal source circuit is configured to activate the first current substantially simultaneously with activation of the pump-up switch and the second signal source circuit is configured to activate the second current substantially simultaneously with activation of the pump-down switch. The first current may be proportional to a pump-up current of the charge pump and the second current may be proportional to a pump-down current of the charge pump.

In other embodiments of the present invention, the first signal source circuit includes a first switch configured to open or to close substantially simultaneously with the pump-up switch of a charge pump responsive to the pump-up signal and a first current source that provides the first current when the first switch is closed. The second signal source circuit includes a second switch configured to open or to close substantially simultaneously with the pump-down switch of the charge pump responsive to the pump-down signal and a second current source that provides the second current when the second switch is closed. The first load and the second load may include resistance elements. The first current and the second current may be, respectively, substantially the same as the pump-up current and the pump-down current of the charge pump. The first current and the second current may be, respectively, greater than the pump-up current and the pump-down current of the charge pump.

In further embodiments of the present invention, the first and second current sources are configured to vary the first current and the second current substantially inversely proportional to variations in a resistance of the first and second load so that the first and second voltage levels have a substantially unchanged level within a range of variance of the resistances of the first and second load. The first load and the second load may include diode-connected transistors.

In other embodiments of the present invention, the voltage level of the first node when the first switch is closed is higher than the voltage level of the first node when the first switch is open and the voltage level of the second node when the second switch is open is higher than the voltage level of the second node when the first switch is closed. The logic circuit may generate the reset signal when the voltage level of the first node has a logic high state and the voltage level of the second node has a logic low state.

In yet other embodiments of the present invention, the logic circuit includes an inverter that inverts a voltage signal from the second node to output an inverted signal. The logic circuit further includes an AND gate that performs an AND operation on the voltage signal from the first node and the inverted signal to generate the reset signal.

In yet further embodiments of the present invention, reset signal generators for a frequency-phase detector include a first signal source that generates a first voltage signal that varies in response to a first current. The first current is generated substantially simultaneously with a pump-up current of a charge pump and the first current is substantially proportional to the pump-up current. A second signal source generates a second voltage signal that varies in response to a second current. The second current is generated substantially simultaneously with a pump-down current of a charge pump and the second current is substantially proportional to the pump-down current. A logic circuit is configured to generate a reset signal based on the first and second voltage signals. The reset signal is activated when the first voltage signal changes to a first predetermined level and the second voltage signal changes to a second predetermined level concurrently with the first voltage signal changing to the first predetermined level and the reset signal is activated after the pump-up current and the pump-down current are substantially simultaneously supplied for a selected time.

In other embodiments of the present invention, the first voltage signal increases as the first current rises and a voltage across the first load increases. The second voltage signal decreases as the second current rises and a voltage across the second load increases. The logic circuit may generate the activated reset signal only when a first input of the logic circuit is of a logic high and a second input of the logic circuit is of a logic low. The first voltage signal may be applied to the first input of the logic circuit, and the second voltage signal may be applied to the second input of the logic circuit.

In further embodiments of the present invention, methods of generating a reset signal in a frequency-phase detector include providing a first current to a first load when a charge pump supplies a pump-up current and providing a second current to a second load when the charge pump supplies a pump-down current. A first voltage is detected a node of the first load resulting from the first current and a second voltage is detected at a node of the second load resulting from the second current. A reset signal is generated based on the detected first and second voltages.

In other embodiments of the present invention, providing the first current to the first load includes providing a first current that is proportional to the pump-up current of the charge pump. Providing the second current to the second load includes providing a second current that is proportional to the pump-down current of the charge pump. Detecting a first voltage includes detecting a first voltage across the first load based on the first current and detecting a second voltage includes detecting a second voltage across the second load based on the second current.

BRIEF DESCRIPTION OF THE DRAWINGS

The above and other features and advantages of the present invention will become more apparent by describing some embodiments thereof with reference to the accompanying drawings, in which.

DETAILED DESCRIPTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
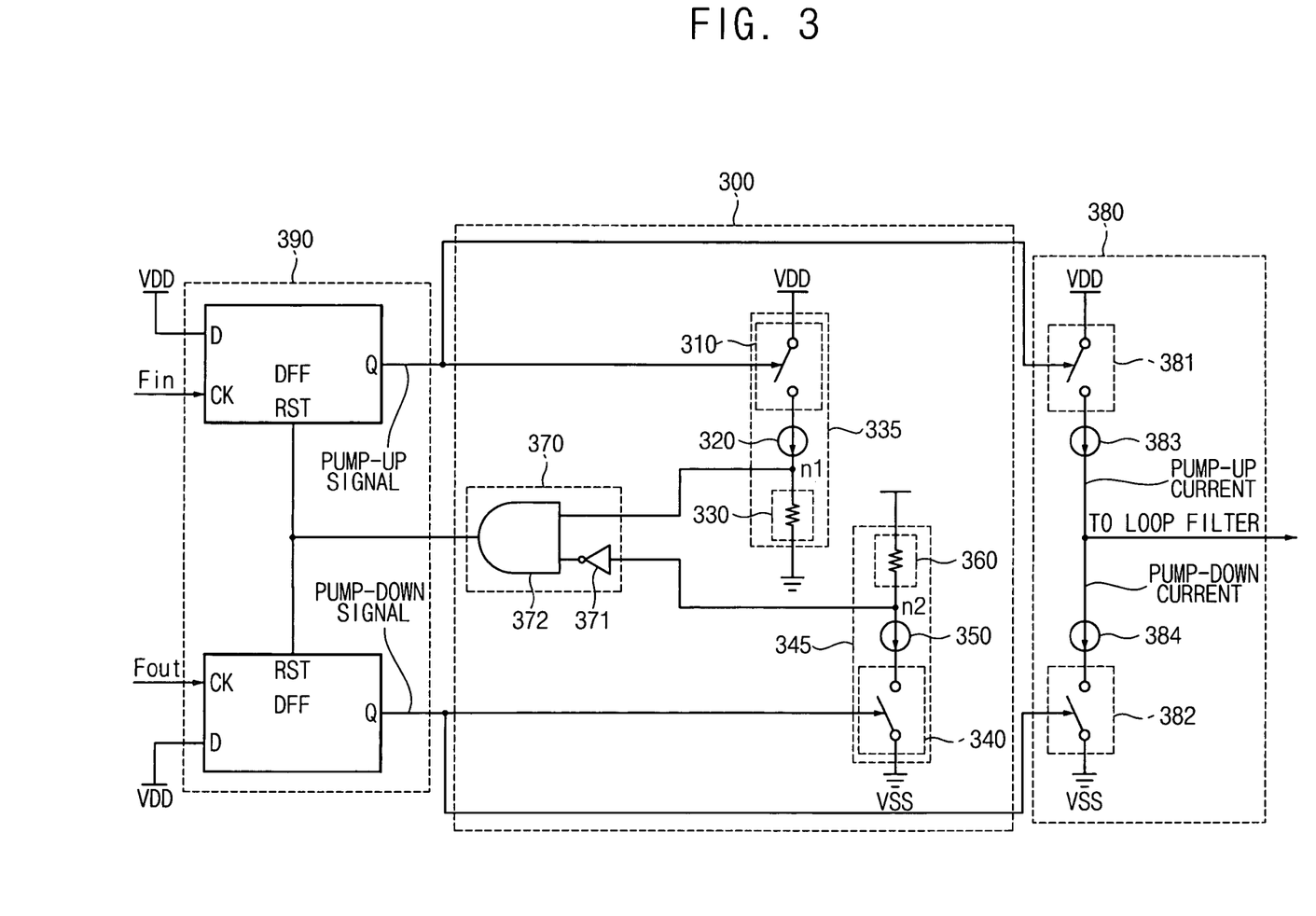
FIG. 3 is a circuit diagram illustrating a charge pump and a frequency-phase detector having a reset signal generator according to some embodiments of the present invention.

FIG. 3 is a circuit diagram illustrating a charge pump and a frequency-phase detector having a reset signal generator according to some embodiments of the present invention. Referring to the embodiments of FIG. 3, the reset signal generator 300 includes a first switch 310, a first current source 320, a first load 330, a second switch 340, a second current source 350, a second load 360 and a logic circuit 370.

The first switch 310 is coupled between a first power supply first power supply voltage VDD and the first current source 320, and operates substantially simultaneously with a pump-up switch 381 of a charge pump 380 responsive to the pump-up signal.

When the pump-up switch 381 of the charge pump 380 and the first switch 310 are implemented with, for example, CMOS (Complementary Metal Oxide Semiconductor) transistors, the substantially simultaneous operation of the first switch 310 and the pump-up switch 381 may be achieved by applying a common pump-up signal to gates of both the first switch 310 and the pump-up switch 381.

The first current source 320 is coupled between the first switch 310 and a first node n1. The first current source 320 may be a current mirror with respect to a pump-up current source 383 of the charge pump 380 and may provide a first current substantially proportional to a pump-up current of the charge pump 380. The first load 330 is illustrated as coupled between the first current source 320 and a second power supply voltage VSS, shown as a ground reference in FIG. 3.

The second switch 340 is coupled between the second power supply voltage VSS and the second current source 350, and operates substantially simultaneously with a pump-down switch 382 of a charge pump 380 responsive to the pump-down signal. If the pump-down switch 382 of the charge pump 380 and the second switch 340 are implemented with, for example, CMOS transistors, the substantially simultaneous operation of the second switch 340 and the pump-down switch 382 may be achieved by applying a common signal to gates of both the second switch 340 and the pump-down switch 382. The second current source 350 is coupled between the second switch 340 and a second node n2. The second current source 350 may be a current mirror with respect to a pump-down current source 384 of the charge pump 380 and may provide a second current, which is proportional to a pump-down current of the charge pump 380. The second load 360 is coupled between the second current source 350 and the first power supply voltage VDD.

The first switch 310, the first current source 320 and the first load 330 as a whole are referred to herein as a first signal source 335. The second switch 340, the second current source 350 and the second load 360 as a whole are referred to herein as a second signal source 345.

The logic circuit 370 in the illustrated embodiments of FIG. 3 generates a reset signal based on voltage signals at the first node n1 and the second node n2, and outputs the reset signal to the frequency-phase detector 390 (shown as coupled to a reset (RST) input of respective flip-flops therein).

The voltage level of the first node n1 is also referred to herein as a first voltage signal and the voltage level of the second node n2 is also referred to herein as a second voltage signal.

The logic circuit 370 may be implemented, for example, with an AND gate 372 and an inverter 371. The inverter 371 logically inverts the voltage level of the second node n2, and outputs the inverted voltage level to an input terminal of the AND gate 372. The other input terminal of the AND gate 372 is shown coupled to the first node n1. An output terminal of the AND gate 372 outputs the reset signal to the frequency-phase detector 390.

The operation of the reset signal generator 300 in the frequency-phase detector will now be described. The pump-up switch 381 of the charge pump 380 is closed in response to a pump-up signal from the frequency-phase detector 390. The first switch 310 is substantially simultaneously closed, and then the first current driven by the first current source 320 flows through the first load 330. The first load 330 may include a resistor. When the first switch 310 is open, the voltage level of the first node n1 is substantially a zero voltage, that is, it is equal to the second power supply voltage VSS, but gradually increases as the first current flows through the first load 330. A product of the first current and a resistance of the first load 330 may be equal to the voltage level of the first node n1, according to the Ohm's law.

The pump-down switch 382 of the charge pump 380 is closed in response to a pump-down signal from the frequency-phase detector 390. The second switch 340 is substantially simultaneously closed, and then the second current driven by the second current source 320 flows through the second load 360. The second load 360 may include a resistor. When the second switch 340 is open, the voltage level of the second node n2 is a voltage corresponding to the first power supply voltage VDD, but gradually decreases as the second current flows through the second load 360. The voltage level of the second node n2 may be equal to (VDD−(the second current×a resistance of the second load)).

When the first switch 310 is closed, the first current source 320 and the first load 330 establish the voltage level of the first node n1, and when the second switch 340 is closed, the second current source 350 and the second load 360 establish the voltage level of the second node n2. Therefore, a desired voltage level of the first node n1 may be obtained by adjusting the first current and the resistance of the first load 330. Likewise, a desired voltage level of the second node n2 may be obtained by adjusting the second current and the resistance of the second load 360. Accordingly, the voltage levels of the first node n1 and the second node n2 may be adjustable, for example, to a logic threshold voltage of the logic circuit 370.

In some embodiments, when the first switch 310 is closed, the voltage level of the first node n1 equals a product of the first current and the resistance of the first load 330, so that the voltage level of the first node n1 may be identified as a logic HIGH by the logic circuit 370 at a given time after the first current flows (i.e., a time based on the rise time of the voltage after the switch is closed). Likewise, when the second switch 340 is closed, the voltage level of the second node n2 equals a product of the second current and the resistance of the second load 360, so that the voltage level of the second node n2 may be identified as a logic LOW by the logic circuit 370 at a given time after the second current flows.

The inverter 371 in the logic circuit 370 of the illustrated embodiments of FIG. 3 receives the voltage of the second node n2, and converts an inputted logic HIGH to a logic LOW (or an inputted logic LOW to a logic HIGH). The AND gate 372 in the logic circuit 370 receives the voltage of the first node n1 and an output of the inverter 371, and outputs a logic HIGH only when both of the inputted voltage levels are of logic HIGHs. Consequently, the logic gate 370 outputs a logic HIGH as the reset signal only when the first node voltage is of a logic HIGH and the second node voltage is of a logic LOW at the same time.

The voltage level of the first node n1 may rise up to a logic HIGH of the logic circuit 370 only when the first switch 310 is closed. Likewise, the voltage level of the second node n2 may fall down to a logic LOW level of the logic circuit 370 only when the second switch 340 is closed. Thus, the logic circuit 370 may only output a logic HIGH as the reset signal when both of the first and second switches 310 and 340 are closed. Furthermore, given the shared input for closing the switches, a logic HIGH is similarly only output as the reset signal when both the pump-up switch 381 and the pump-down switch 382 in the charge pump 380 are closed.

Because the voltage levels of the first node n1 and the second node n2 respectively depend on the currents flowing through the first load 330 and the second load 360 and because the reset signal is generated according to the voltage level changes in the first node n1 and the second node n2 suggests that the reset signal is generated when both of the first and second currents flow. That is, the reset signal is generated when both of the pump-up and pump-down currents flow.

As the first load 330 and the second load 360 may, respectively, share the impressed voltages on the first current source 320 and the second current source 350 (to obtain a desired voltage signal), so that the first and second loads 330 and 360 may relieve the voltage burdens on the first and second current sources 320 and 350, but also may assure (given voltage rise time characteristics) that the reset signal would be generated after the pump-up and pump-down currents in the charge pump 380 flow sufficiently. Additionally, designing the logic circuit 370 may be simplified as a designer may choose the desired voltage levels of the first node n1 and the second node n2. Furthermore, a rise (or falling) time to the logic threshold voltage of the logic circuit 370 may be controllable, because the rise (or falling) time depends on the resistances of the first and second loads 330 and 360.

Figure 4:
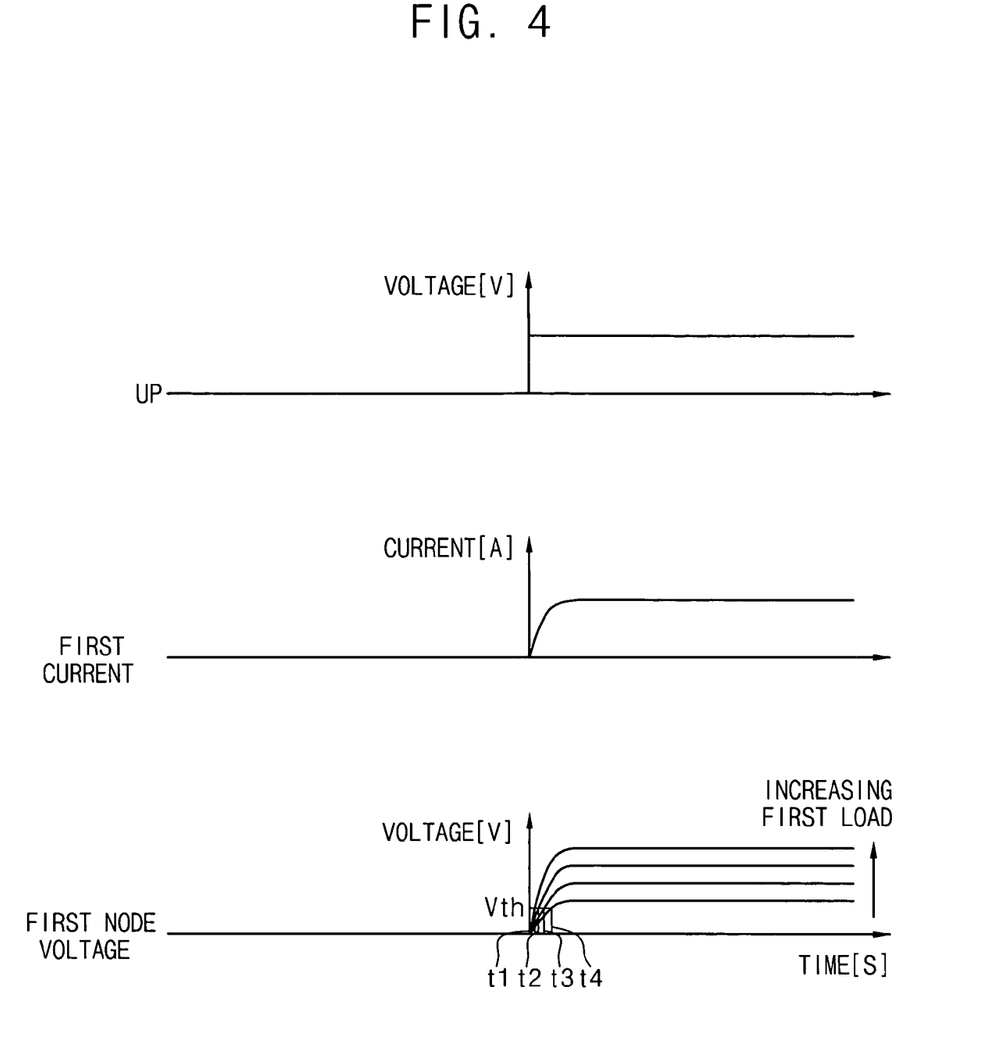
FIG. 4 shows graphs illustrating a node voltage variation of a reset signal generator according to some embodiment of the present invention.

FIG. 4 shows graphs illustrating a node voltage variation of the reset signal generator according to some embodiments of the present invention. A voltage Vth in FIG. 4 indicates the logic threshold voltage of the logic circuit 370. Referring to FIG. 4, as an impedance of the first load increases, the rise time to reach the voltage Vth decreases from $t_4$ to $t_1$. By varying the first load 330 in FIG. 3, the designer may control the rise time for the node voltage of the first node n1 to rise up to the logic threshold voltage of the logic circuit 370.

Likewise, by varying the second load 360 in FIG. 3, the designer may control the falling time for the node voltage of the second node n2 to fall down to the logic threshold voltage of the logic circuit 370. Consequently, by adjusting the impedances of the first and second loads 330 and 360 in FIG. 3, the rise (or falling) times, during which the voltage level of the first node n1 and the second node n2 rises up (or falls down) to the respective logic threshold voltages of the logic circuit 370, may be adjusted so as to generate the reset signal with a desired timing.

The embodiments illustrated in FIG. 3 present resistors as the first load 330 and the second load 360, however, the loads may be implemented with diode-connected CMOS transistors and the like. The diode-connected CMOS transistors may have relatively large resistance, so that the first and second currents may be reduced. When passive resistance elements are implemented on a semiconductor chip, the passive resistance elements typically have about a 20 percent variation range due to process variation, but effects of such variation may be minimized by adopting a Vt-referenced self biased type current mirror, etc., as the first and second current sources. The Vt-referenced self biased type current mirror may supply a bias current in inverse proportion to the resistance.

Figure 5:
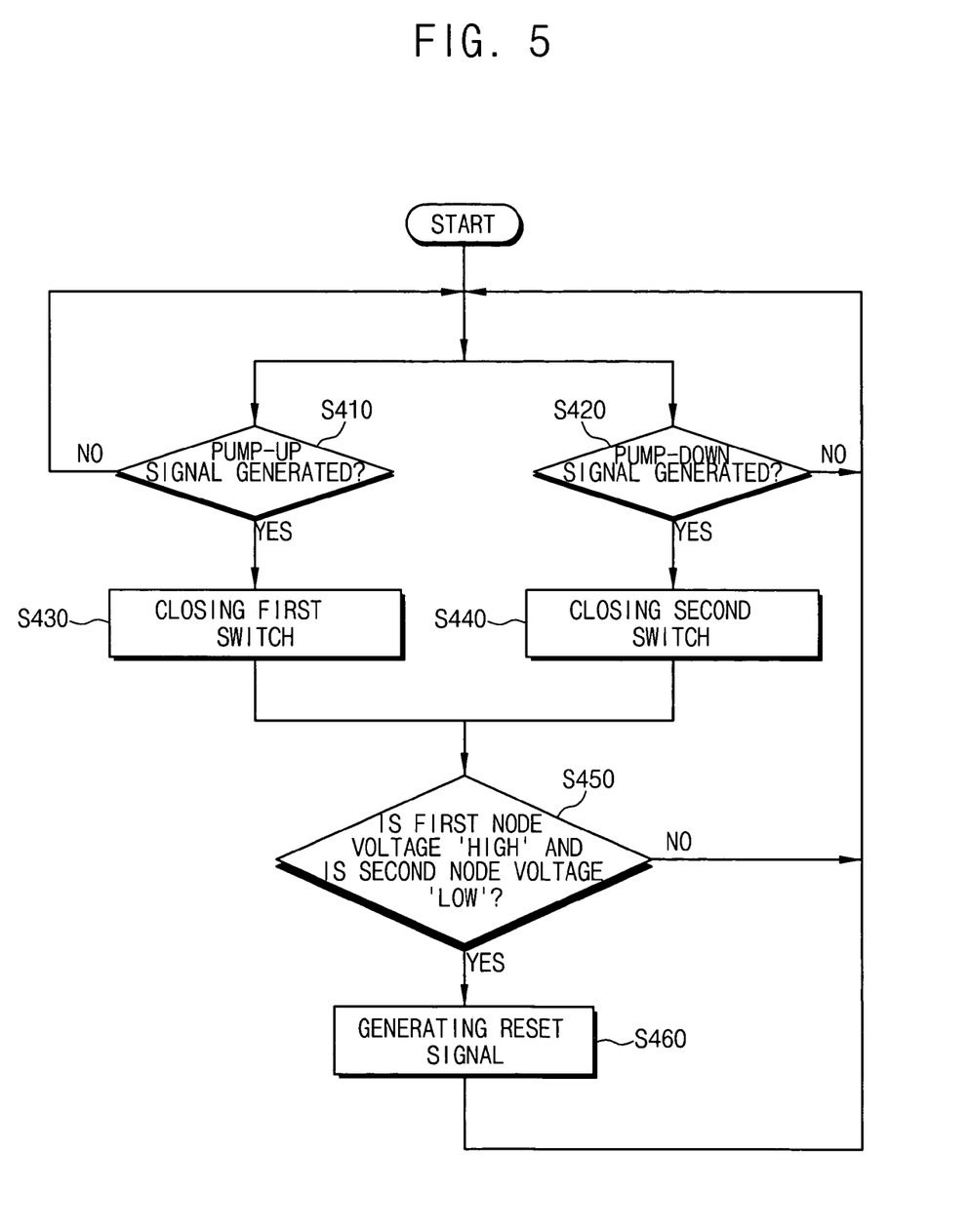
FIG. 5 is a flow chart illustrating operations of the reset signal generator of the frequency-phase detector in FIG. 3 according to some embodiments of the present invention.

FIG. 5 is a flow chart illustrating operations for the reset signal generator of the frequency-phase detector in FIG. 3 according to some embodiments of the present invention.

Referring to the embodiments of FIG. 5, it is determined whether the pump-up signal of the frequency-phase detector 390 is generated (Block S410). If so, the first switch 310 closes so that the first current flows through the first load 330 (Block S430). Likewise, it is determined whether the pump-down signal of the frequency-phase detector 390 is generated (Block S420). If so, the second switch 340 closes so that the second current flows through the second load 360 (Block S440). It is determined whether the voltage level of the first node n1 is of a logic HIGH and the voltage level of the second node n2 is of a logic LOW (Block S450). The logic circuit 370 outputs a logic HIGH as the reset signal only when the voltage level of the first node n1 is of a logic HIGH and the voltage level of the second node n2 is of a logic LOW (Block S460). Note that inverse logic may be used in accordance with various embodiments of the present invention and that the particular HIGH and LOW states described herein are by way of example.

Consequently, only when both of the pump-up signal and the pump-down signal from the frequency-phase detector are activated, both of the first and second currents flow, and then the voltage level of the first node turns to a logic HIGH and the voltage level of the second node turns to a logic LOW, so that the reset signal is generated.

Figure 6:
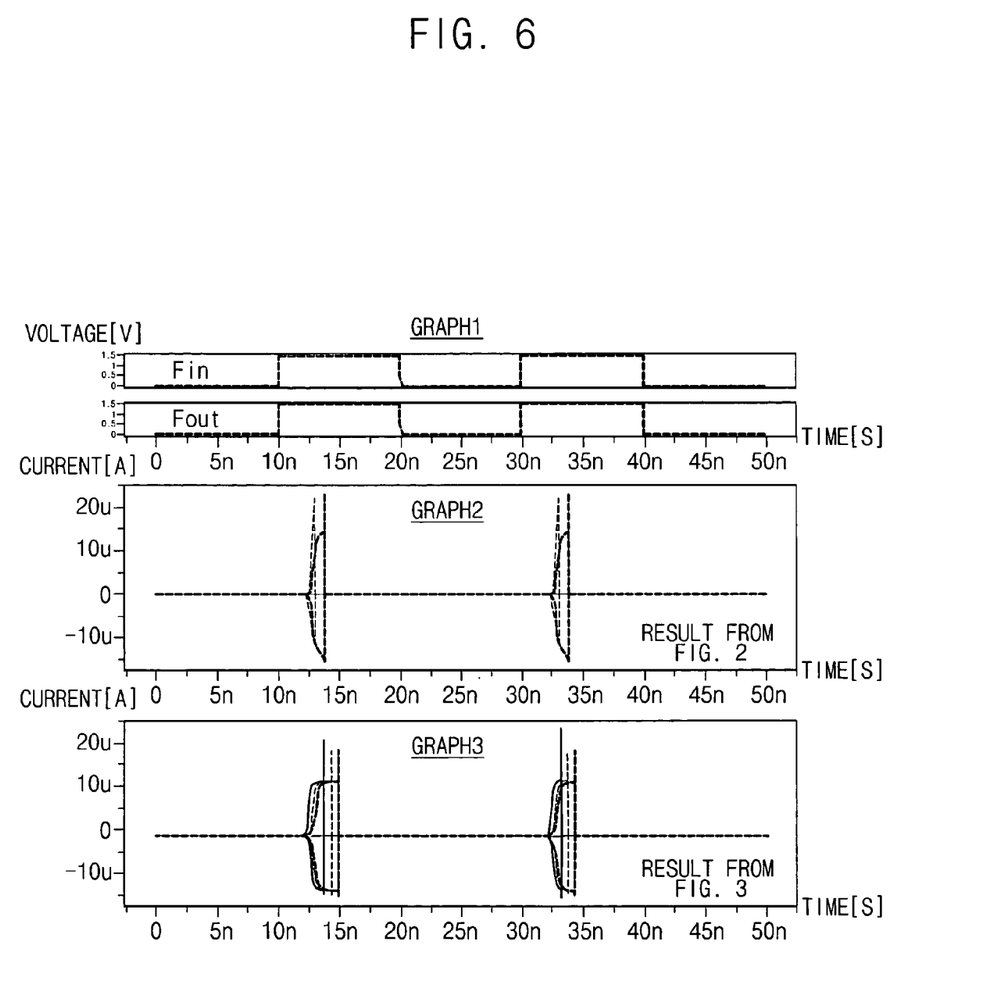
FIG. 6 shows graphs illustrating a performance comparison between the reset signal generators shown in FIG. 2 and in FIG. 3 according to some embodiments of the present invention.

FIG. 6 is graphs illustrating performance comparison between the reset signal generators in FIGS. 1 and 2 and in FIG. 3 according to some embodiments of the present invention. FIG. 6 illustrates simulation results for the pump-up/pump-down currents from the frequency-phase detectors with different process variations, when the two inputs Fin and Fout of the frequency-phase detector have almost no phase difference (graph1). Positive currents in graph2 and graph3 refer to the pump-up currents in FIGS. 1 and 2 and FIG. 3. Negative currents in graph2 and graph3 refer to the pump-down currents in FIGS. 1 and 2 and FIG. 3.

As for the conventional delayed reset signal generator in FIG. 2, in a normal process condition (shown as thin dashed lines in graph2), the frequency-phase detector has a sufficient delay time by the delay device 220 before the reset signal generated. Sufficient pump-up/pump-down currents (10 uA herein) flow, and then the dead zone is removed.

In another process condition, the frequency-phase detector has an insufficient delay time. The pump-up and pump-down currents barely flow, which indicates that the dead zone still exists. In another process condition (thick dashed lines in graph2), the frequency-phase detector has an excessive delay time. The pump-up/pump-down currents flow for the excessive delay time, so the excessive currents unnecessarily flow, although the dead zone is removed.

In contrast, for the reset signal generator in FIG. 3 according to some embodiments of the present invention, the dead-zones are substantially eliminated because sufficient pump-up/pump-down currents flow before the reset signal is generated, and also the pump-up/pump-down currents doesn't flow excessively, in a normal process condition (thin dashed lines in graph3) as well as other process conditions (normal solid lines and thick dashed lines in graph3).

As described above, the reset signal generator and the reset signal generating method according to some embodiments of the present invention detect voltage changes due to currents flowing through the first and second loads, and then generate the reset signal. Therefore, the voltage levels may be selected properly according to the logic threshold voltages in the logic circuit. The reset signal generating method may be adopted for a source switch method.

In addition, by adjusting the sizes of the loads, the rise (or falling) times to rise up (or fall down) to the logic threshold voltages of the logic circuit may be adjusted so that the reset signal may be generated after the pump-up and pump-down currents in the charge pump flow sufficiently (to lock the PLL). Further, the current sources and the loads share impressed voltages, which range from the power voltage VDD to a ground voltage, so that potential burden of the current sources may be reduced and the currents sources may supply stable currents.

The reset signal generator may eliminate the dead zone with smaller power consumption, in spite of process variation in manufacturing or the like, and may thereby reduce the static phase error and jitter in the phase locked loop.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein

What is claimed is:

1. A reset signal generator for a frequency-phase detector, the reset signal generator comprising:
   a first signal source circuit coupled to a pump-up signal of the frequency-phase detector, the first signal source circuit including a first load therein establishing a voltage level at a first node when a first current flows through the first load, the first signal source circuit being configured to activate the first current responsive to the pump-up signal;
   a second signal source circuit coupled to a pump-down signal of the frequency-phase detector, the second signal source circuit including a second load therein establishing a voltage level at a second node when a second current flows through the second load, the second signal source circuit being configured to activate the second current responsive to the pump-down signal; and
   a logic circuit configured to generate the reset signal responsive to the voltage levels at the first node and at the second node;
   wherein the first signal source circuit includes a first current source and wherein the second signal source signal includes a second current source and wherein the first and second current sources are configured to vary the first current and the second current substantially inversely proportional to variations in a resistance of the first and second load so that the first and second voltage levels have a substantially unchanged level within a range of variance of the resistances of the first and second load.

2. The reset signal generator of claim 1, wherein the pump-up signal activates a pump-up switch of a charge pump and the pump-down signal activates a pump-down switch of the charge pump and wherein the first signal source circuit is configured to activate the first current substantially simultaneously with activation of the pump-up switch and wherein the second signal source circuit is configured to activate the second current substantially simultaneously with activation of the pump-down switch.

3. The reset signal generator of claim 2, wherein the first current is proportional to a pump-up current of the charge pump and wherein the second current is proportional to a pump-down current of the charge pump.

4. A reset signal generator for a frequency-phase detector, the reset signal generator comprising:
 a first signal source circuit coupled to a pump-up signal of the frequency-phase detector, the first signal source circuit including a first load therein establishing a voltage level at a first node when a first current flows through the first load, the first signal source circuit being configured to activate the first current responsive to the pump-up signal;
 a second signal source circuit coupled to a pump-down signal of the frequency-phase detector, the second signal source circuit including a second load therein establishing a voltage level at a second node when a second current flows through the second load, the second signal source circuit being configured to activate the second current responsive to the pump-down signal; and
 a logic circuit configured to generate the reset signal responsive to the voltage levels at the first node and at the second node;
 wherein the pump-up signal activates a pump-up switch of a charge pump, the pump-up switch being separate from the first signal source circuit and wherein the pump-down signal activates a pump-down switch of the charge pump, the pump-down switch being separate from the second signal source circuit;
 wherein the first signal source circuit includes:
 a first switch configured to open or to close substantially simultaneously with the pump-up switch of a charge pump responsive to the pump-up signal; and
 a first current source that provides the first current when the first switch is closed;
 wherein the second signal source circuit includes:
 a second switch configured to open or to close substantially simultaneously with the pump-down switch of the charge pump responsive to the pump-down signal; and
 a second current source that provides the second current when the second switch is closed.

5. The reset signal generator of claim 4, wherein the first load and the second load include resistance elements.

6. The reset signal generator of claim 5, wherein the first current and the second current are, respectively, substantially the same as the pump-up current and the pump-down current of the charge pump.

7. The reset signal generator of claim 5, wherein the first current and the second current are, respectively, greater than the pump-up current and the pump-down current of the charge pump.

8. The reset signal generator of claim 5, wherein the first and second current sources are configured to vary the first current and the second current substantially inversely proportional to variations in a resistance of the first and second load so that the first and second voltage levels have a substantially unchanged level within a range of variance of the resistances of the first and second load.

9. The reset signal generator of claim 4, wherein the first load and the second load includes diode-connected transistors.

10. The reset signal generator of claim 4, wherein the voltage level of the first node when the first switch is closed is higher than the voltage level of the first node when the first switch is open, and wherein the voltage level of the second node when the second switch is open is higher than voltage level of the second node when the first switch is closed.

11. The reset signal generator of claim 10, wherein the logic circuit generates the reset signal when the voltage level of the first node has a logic high state and the voltage level of the second node has a logic low state.

12. The reset signal generator of claim 11, wherein the logic circuit comprises:
 an inverter that inverts a voltage signal from the second node to output an inverted signal; and
 an AND gate that performs an AND operation on the voltage signal from the first node and the inverted signal to generate the reset signal.

13. A reset signal generator for a frequency-phase detector comprising:
 a first signal source that generates a first voltage signal that varies in response to a first current that is generated when a switch included in the first signal source is closed, the first current being generated substantially simultaneously with a pump-up current of a charge pump and the first current being substantially proportional to the pump-up current;
 a second signal source that generates a second voltage signal that varies in response to a second current that is generated when a switch included in the second signal source is closed, the second current being generated substantially simultaneously with a pump-down current of a charge pump and the second current being substantially proportional to the pump-down current; and
 a logic circuit configured to generate a reset signal based on the first and second voltage signals, wherein the reset signal is activated when the first voltage signal changes to a first predetermined level and the second voltage signal changes to a second predetermined level concurrently with the first voltage signal changing to the first predetermined level, and wherein the reset signal is activated after the pump-up current and the pump-down current are substantially simultaneously supplied for a selected time;
 wherein the first voltage signal increases as the first current rises and a voltage across the first load increases, and wherein the second voltage signal decreases as the second current rises and a voltage across the second load increases.

14. The reset signal generator of claim 13, wherein the logic circuit generates the activated reset signal only when a first input of the logic circuit is of a logic high and a second input of the logic circuit is of a logic low.

15. The reset signal generator of claim 14, wherein the first voltage signal is applied to the first input of the logic circuit, and the second voltage signal is applied to the second input of the logic circuit.

16. A method of generating a reset signal in a frequency-phase detector comprising:
 providing a first current to a first load when a charge pump supplies a pump-up current;
 providing a second current to a second load when the charge pump supplies a pump-down current;
 detecting a first voltage at a node of the first load resulting from the first current;
 detecting a second voltage at a node of the second load resulting from the second current; and
 wherein providing the first current and providing the second current include varying the first current and the second current substantially inversely proportional to variations in a resistance of the first and second loads so that the first and second voltage have a substantially unchanged level within a range of variance of the resistances of the first and second load.

17. The method of claim 16, wherein:
providing the first current to the first load comprises providing a first current that is proportional to the pump-up current of the charge pump;
providing the second current to the second load comprises providing a second current that is proportional to the pump-down current of the charge pump;

detecting a first voltage comprises detecting a first voltage across the first load based on the first current; and
detecting a second voltage comprises detecting a second voltage across the second load based on the second current.

* * * * *